United States Patent
Caletka et al.

(10) Patent No.: US 6,603,195 B1
(45) Date of Patent: Aug. 5, 2003

(54) PLANARIZED PLASTIC PACKAGE MODULES FOR INTEGRATED CIRCUITS

(75) Inventors: David V. Caletka, Apalachin, NY (US); James L. Carper, Colchester, VT (US); John P. Cincotta, Essex Junction, VT (US); Kibby B. Horsford, Essex, VT (US); Gary H. Irish, Jericho, VT (US); John J. Lajza, Jr., Essex Junction, VT (US); Gordon C. Osborne, Jr., Essex Junction, VT (US); Charles R. Ramsey, Essex Junction, VT (US); Robert M. Smith, Jericho, VT (US); Michael J. Vadnais, George, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/605,173

(22) Filed: Jun. 28, 2000

(51) Int. Cl.[7] ............... H01L 23/50; H01L 23/495; H01L 23/02; H01L 23/48; H01L 23/28
(52) U.S. Cl. ............ 257/670; 257/666; 257/669; 257/674; 257/696; 257/698; 257/472
(58) Field of Search ............... 257/678, 666, 257/676, 669–673, 691, 690, 692, 693, 696, 698, 684, 796

(56) References Cited

U.S. PATENT DOCUMENTS

| | | | | |
|---|---|---|---|---|
| 5,229,329 A | * | 7/1993 | Chai et al. | |
| 5,585,600 A | * | 12/1996 | Froebel et al. | 257/666 |
| 5,686,698 A | | 11/1997 | Mahadevan et al. | 257/666 |
| 5,708,293 A | * | 1/1998 | Ochi et al. | 257/666 |
| 5,744,827 A | * | 4/1998 | Jeong et al. | 257/686 |
| 5,789,806 A | | 8/1998 | Chua et al. | 257/672 |
| 5,877,937 A | | 3/1999 | Shibata et al. | 257/692 |
| 5,897,339 A | * | 4/1999 | Song et al. | 438/118 |
| 5,917,241 A | | 6/1999 | Nakayama et al. | 257/728 |
| 5,923,957 A | * | 7/1999 | Song et al. | 438/118 |
| 5,933,708 A | * | 8/1999 | Sim et al. | 438/118 |
| 6,063,650 A | | 5/2000 | King et al. | 438/123 |
| 6,522,299 B2 | * | 6/2001 | Masuda et al. | 257/686 |
| 6,268,646 B1 | * | 7/2001 | Sugimoto et al. | 257/673 |
| 6,277,225 B1 | * | 8/2001 | Kinsman et al. | 257/692 |
| 6,310,288 B1 | * | 10/2001 | Moden | 257/693 |

* cited by examiner

*Primary Examiner*—Alexander O. Williams
(74) *Attorney, Agent, or Firm*—Anthony J. Canale; Robert A. Walsh; James M. Leas

(57) ABSTRACT

A semiconductor module includes a semiconductor chip, a lead frame having lead fingers, and a down set member within an encapsulant for reduce warpage and providing a more planar package by balancing thermal stress between the lead fingers and the encapsulant. The down set member can be a bent portion of the lead frame. It can also be a separate body, such as a dummy semiconductor chip.

16 Claims, 6 Drawing Sheets

PLANARIZED PLASTIC PACKAGE MODULES FOR INTEGRATED CIRCUITS

FIELD OF THE INVENTION

This invention generally relates to plastic packages for integrated circuits. More particularly, it relates to improved structures for reducing warpage of the plastic package module and for providing a more planar module. Even more particularly, it relates to an improved lead frame that provides a more planar module.

BACKGROUND OF THE INVENTION

Integrated circuit chips are most commonly electrically connected to the outside world through a highly conductive lead frame. Wire bond pads of a chip are connected to the thicker and sturdier lead frame conductors with delicate 1 mil diameter wires. The chip, the delicate wires and neighboring portions of the lead frame are encapsulated in molded plastic to protect the chip and the wires from damage, while portions of lead frame conductors that extend beyond the plastic are available for soldering to the next level of assembly, such as a printed circuit board. Millions of modules of this type are sold every year.

Various problems have been identified with this packaging concept, and one of these is warpage. High stresses that warp or bend the finished module can crack the integrated circuit chip and stop it from functioning properly. The bending and cracking can occur during the packaging process or later after the chip package has been mounted in an electronic device in use by a customer. The reductions in yield add substantially to the cost of the packaged chip, and fails that occur during use can annoy customers.

Even if the chip does not crack package bending can cause serious problems during the soldering process to attach lead frames of the module to a printed circuit board. If the plastic package module warps, positions of lead tips can move out of planarity, and some lead tips may not make contact to pads on the board during the soldering step. To avoid this problem, an industry planarity specification, MS-024, established by JEDEC, provides that all leads must be planar with no two leads deviating from each other by more than 4 mils.

Package bending arises if the package is made of different materials that have different thermal coefficients of expansion (TCE). Typically the silicon chip, the metal lead frame, and the plastic encapsulant have very different TCEs, and the package can experience substantial changes in temperature, either during manufacture or during use. Thus, a better solution for plastic packaging is needed that avoids temperature stresses that can cause warpage, and this solution is provided by the following invention.

SUMMARY OF THE INVENTION

It is therefore an object of the present invention to provide a way to reduce or eliminate warpage of plastic packages.

It is a further object of the present invention to provide a lead frame design that reduces warpage.

It is a further object of the present invention to provide a lead frame that balances forces so that bending is avoided when temperature changes.

It is a feature of the present invention that a lead frame has elements for electrically connecting to a chip on one level and extra elements for balancing stress on a second level within the plastic encapsulant.

It is an advantage of the present invention that stresses are balanced and bending is avoided while the package experiences a large change in temperature.

These and other objects, features, and advantages of the invention are accomplished by a chip package comprising a semiconductor chip having contact pads and a lead frame having lead fingers spaced at least a first distance from the contact pads and located on a first level adjacent the contact pads. An encapsulant encapsulates the chip and a portion of the lead frame. A material located on a second level is also within the encapsulant. The material has an area comprising a length and a width on this second level. The material also has a thickness, the length and width being greater than the thickness. The material extends a second distance from the chip, wherein said second distance is greater than the first distance. The material on the second level is for providing a more planar package by balancing thermal stress between the lead frame and the encapsulant.

The present inventors recognized that the warpage problem is usually greater when the, chip has an area substantially smaller than the package. Thus, as generations of chips are produced that are smaller in size while the package remains the same size, the warpage problem has increased. The present invention provides a way to provide smaller chips within the package without increasing warpage. In a preferred embodiment of the invention the material is an integral portion of the lead frame. It is a bent portion of the lead frame, within the encapsulant on a different level than the portion that is electrically connected to the chips. The material may comprise a portion of the lead frame that is not electrically connected to a lead when packaging is complete. In another embodiment, the material is a body, such as a second semiconductor chip, that is not electrically connected to the bond pads of the chip with wires. The second semiconductor chip can be mounted to a tape for holding it in position during assembly.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present inventors recognized that warpage can be reduced or avoided by balancing forces within the plastic package. They recognized that when the thickness of plastic above the lead frame is different than the thickness below the lead frame, the package acts like a bimetallic strip and bends depending on the temperature. To reduce or avoid bending the inventors provided an additional layer of material in the plastic at a different level than the connected leads of the lead frame to balance the forces. In one embodiment, a portion of lead frame material is bent to a different level than that used for remaining portions of the lead frame to balance the forces. In another embodiment, a lead finger is bent down and back up to better balance forces on that lead finger.

Figure 1A:
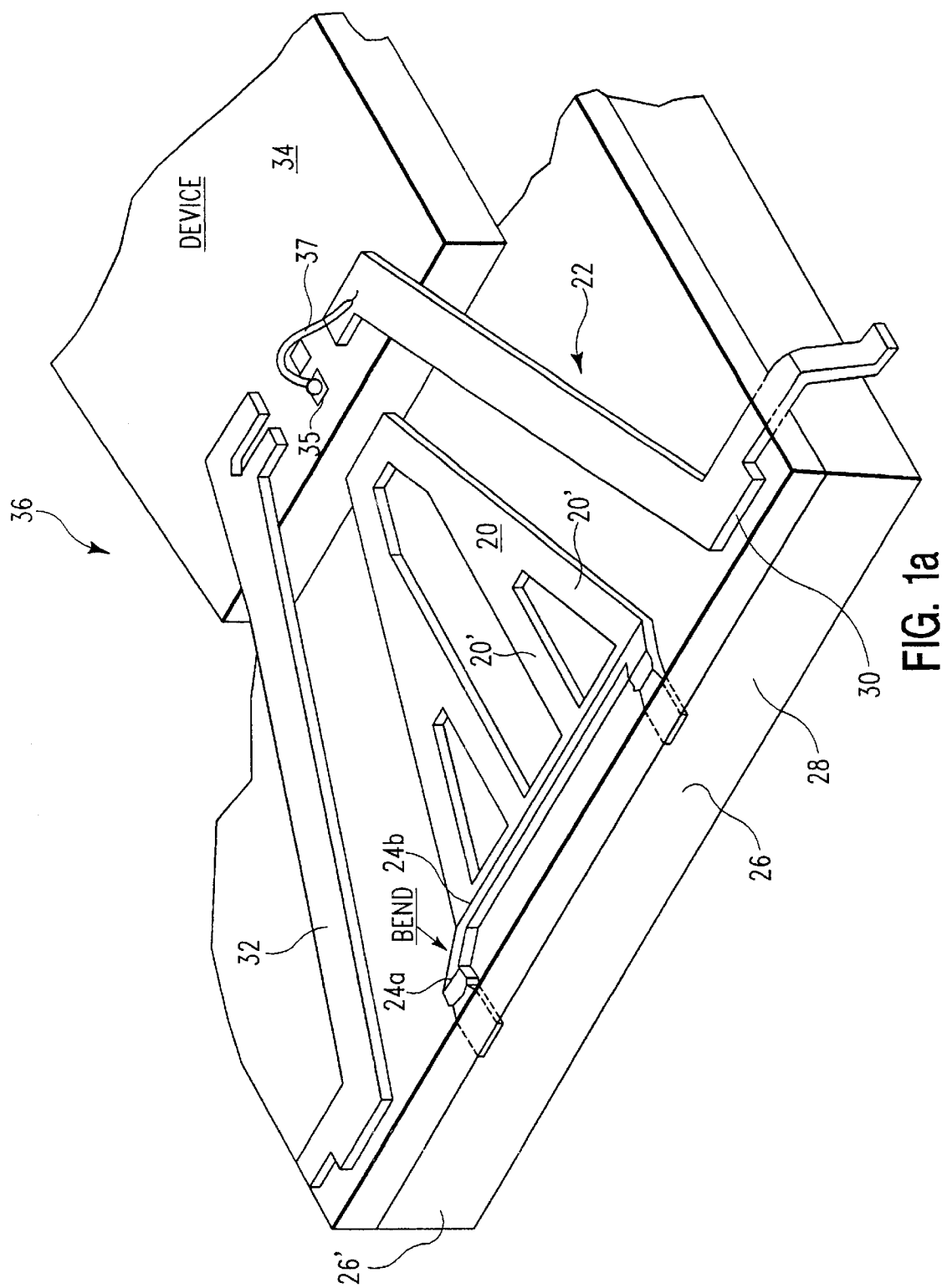
FIG. 1a is a three dimensional view of a module comprising a semiconductor chip and a lead frame having a down set portion separate from lead fingers.

Down set tie bar 20 of lead frame 22 is bent at bend 24a and bend 24b within plastic encapsulant 26 to a substantially lower level 28 than level 30 of lead fingers 32 of lead frame 22, as shown in FIG. 1a. Level 28 is selected to provide a bimaterial bending force that balances some or all of the forces on lead fingers 32 and integrated circuit chip 34 of module 36. In addition, down set tie bar 20 extends from a position adjacent an end of the package to a position adjacent an edge of chip 34 to maximize the area of down set tie bar 20 and maximize the effect of the down setting. Thus, package warpage is reduced or eliminated. Preferably, down set tie bar 20 has an A shape to provide maximum area within space provided by lead fingers 32 and to provide mechanical strength and rigidity. Stability is also increased by the provision of several support struts 20' within the interior of down set tie bar 20. Support struts 20' are oriented parallel to the flow of liquid plastic compound during molding so that the tie bar is not lifted as liquid plastic compound fills the body. Providing the largest area of down set tie bar 20 possible provides the greatest force to counter the force of higher lead fingers 32. Preferably down set tie bar 20 is parallel with lead fingers 32 but on a different plane. Bends 24a, 24b are accomplished with a tool that clamps lead frame 22 adjacent to tie bar 20 and then presses on tie bar 20 with a tool that provides both bends sufficiently that when the bending operation is complete, down set tie bar is at the desired height and is parallel to lead fingers 32. Down set tie bar 20 is designed to allow a minimum clearance of 32 mils to adjacent lead fingers 32 and a minimum clearance of 23 mils to the edge of a nominally sized and positioned chip 34 to avoid electrical shorting or mechanical interface within the module 36. These dimensions are plus or minus a one mil tolerance. Down set tie bar 20 can also be provided with a downward slope within encapsulant 26.

Desirably, lead fingers 32 connected to bond pads 35 of chip 34 through wire bond wires 37 are located high in encapsulant 26. Stress between module 36 and a printed circuit board (not shown) to which it is attached is reduced to the extent lead fingers 32 are elevated within encapsulant 26 of module 36. Thus, reliability of the connection to the circuit board is enhanced by providing lead fingers 32 high up as they exit encapsulant 26 while stress resulting from that high placement within module 36 is reduced by providing downset tie bar 20 to balance thermal stress within encapsulant 26.

Figure 1B:
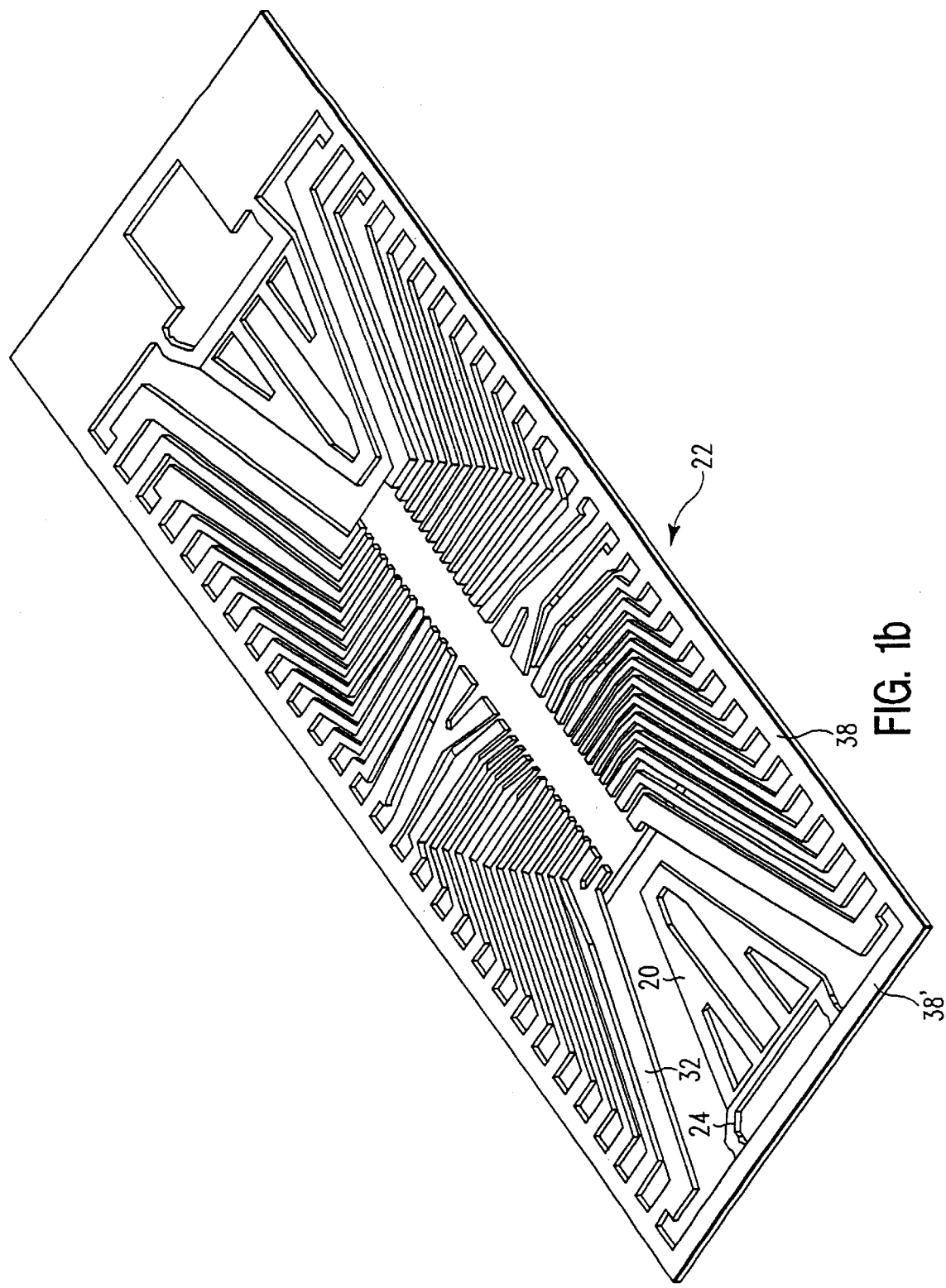
FIG. 1b is a three dimensional view of the lead frame of FIG. 1a showing the down set portion connected to linked ends of fingers of the lead frame.

After encapsulation with plastic is complete, connected ends 38 of lead fingers 32 (FIG. 1b) are cut off and lead fingers 32 are bent into position for mounting to a printed circuit board. Linked ends 38' (FIG. 1b) of down set tie bar 20 extending beyond encapsulant 26 are cut off along edge 26' of encapsulant 26. Downset tie bar 20 is now entirely disconnected from remaining portions of lead frame 22 and from chip 34.

The introduction of down set tie bar 20 reduced warpage of thin small outline plastic packages (TSOP) from 3½ mils to 2 mils, or 42%. This 40 mil thick plastic package used a molded encapsulant with a TCE of about 13, had a silicon chip having a TCE of 3.5, and a lead frame made of alloy 42 having a TCE of about 4. Lead fingers 32 were about 5 mils thick and were located about 9 mils from the top surface of encapsulant 26 and about 26 mils from the bottom of the encapsulant. Chip 34 was about 12 mils thick and is located about 17 mils from the top surface of encapsulant 26. Lead fingers 32 are mounted on chip 34 with tape 46a which is about 3 mils thick (FIG. 4). Down set tie bar 20 was down set about 15 mils lower than lead fingers 32 within encapsulant 26 to provide the improvement in warpage. Further improvement in warpage could be achieved by increasing the area of down set tie bar 20 or increasing the amount of down set. Down set tie bar 20 is designed to allow minimum clearance of 32 mils to adjacent lead fingers 32 and a minimum clearance of 23 mils to end of chip 34, to avoid electrical shorting or mechanical interference within module 36.

Figure 2:
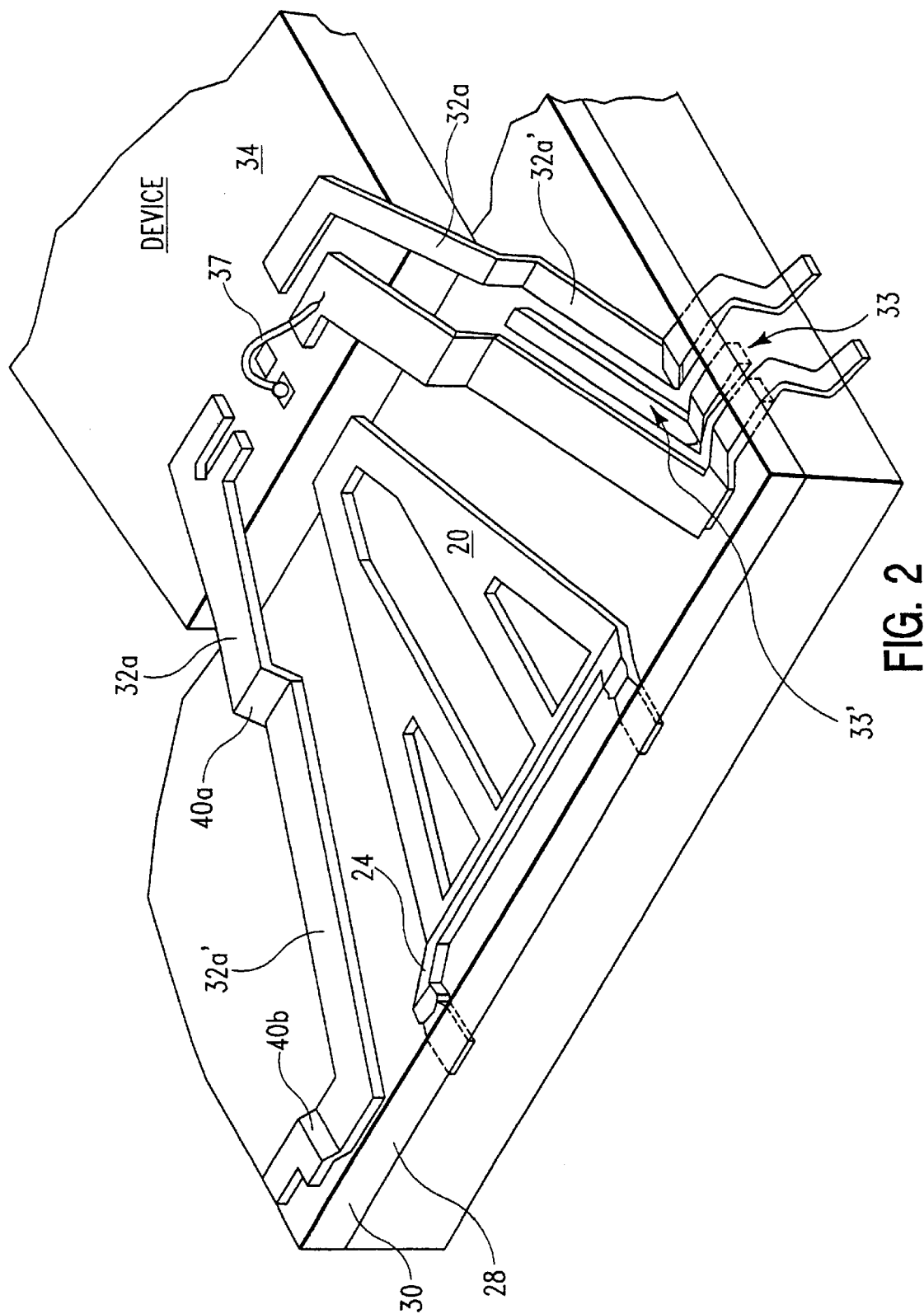
FIG. 2 is a three dimensional view of another embodiment showing a module comprising a semiconductor chip and a lead frame having lead fingers with down set portions.

In an alternate embodiment, portions of lead fingers 32a are down set along region 32a', as shown in FIG. 2. In this case lead fingers 32a have bends 40a and 40b to provide down set region 32a' at lower level 28 than level 30 of lead fingers 32a of lead frame 22a. Down set portions 32a' of lead fingers 32a can be provided either in addition to or instead of down set tie bar 20. In addition, additional fingers 33 having down set regions 33' may be provided in normally vacant space between lead fingers 32a.

Figure 3:
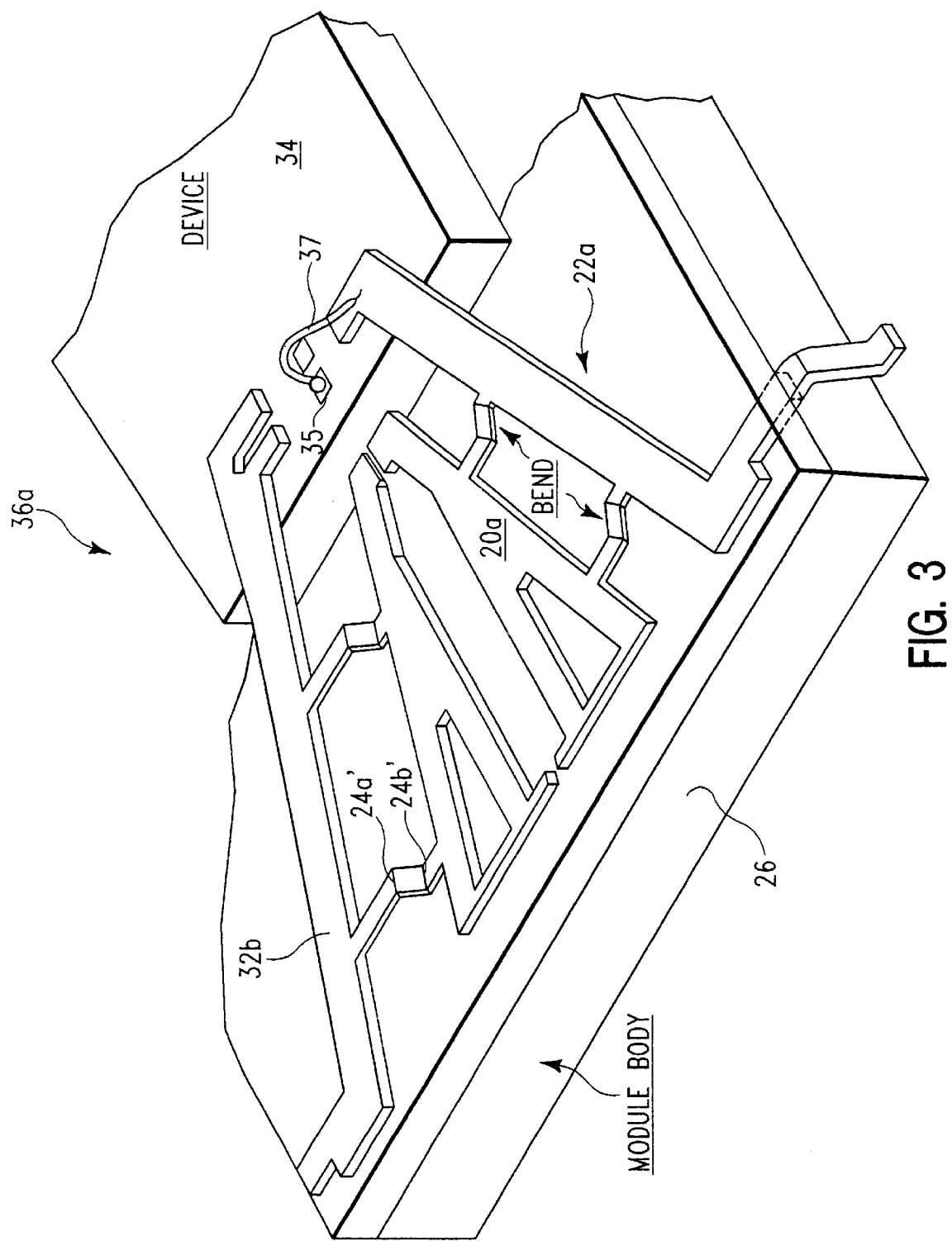
FIG. 3 is a three dimensional view of another embodiment showing a module comprising a semiconductor chip and a lead frame having a down set portion connected to lead fingers.

In another alternate embodiment down set tie bar 20a can be connected to one or more lead fingers 32b, as shown in FIG. 3. In this case bends 24a', 24b' provide down set tie bar 20a at lower level 28 than level 30 of lead fingers 32a of lead frame 22a. Preferably, lead fingers 32b to which down set tie bars 20a are electrically connected to ground. Down set tie bar 20a can be split if desired, as shown in FIG. 3.

Figure 4A:
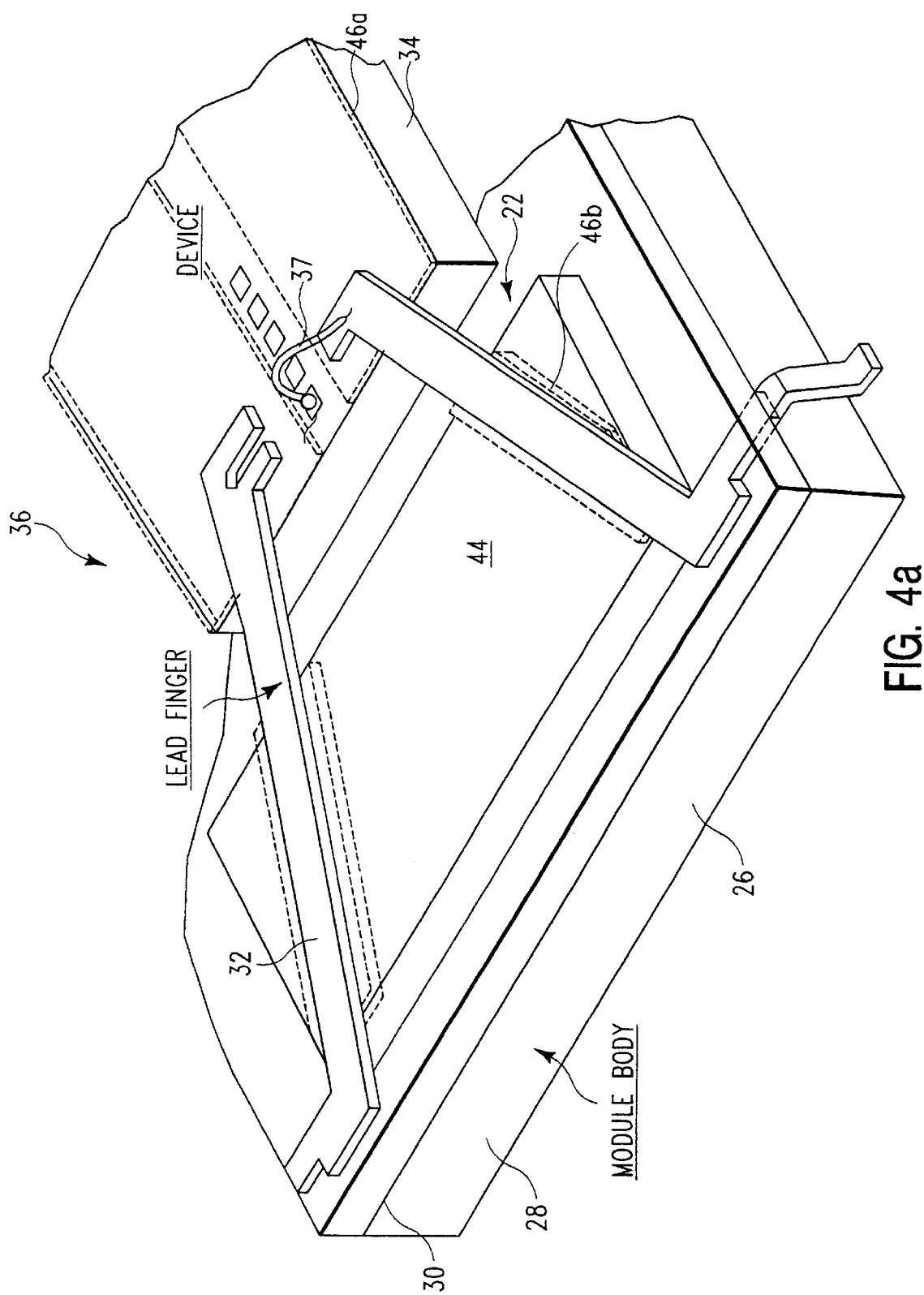
FIG. 4a is a three dimensional view of another embodiment showing a module comprising a semiconductor chip, a lead frame, and a dummy chip, the dummy chip located at a lower level than the lead fingers.
Figure 4B:
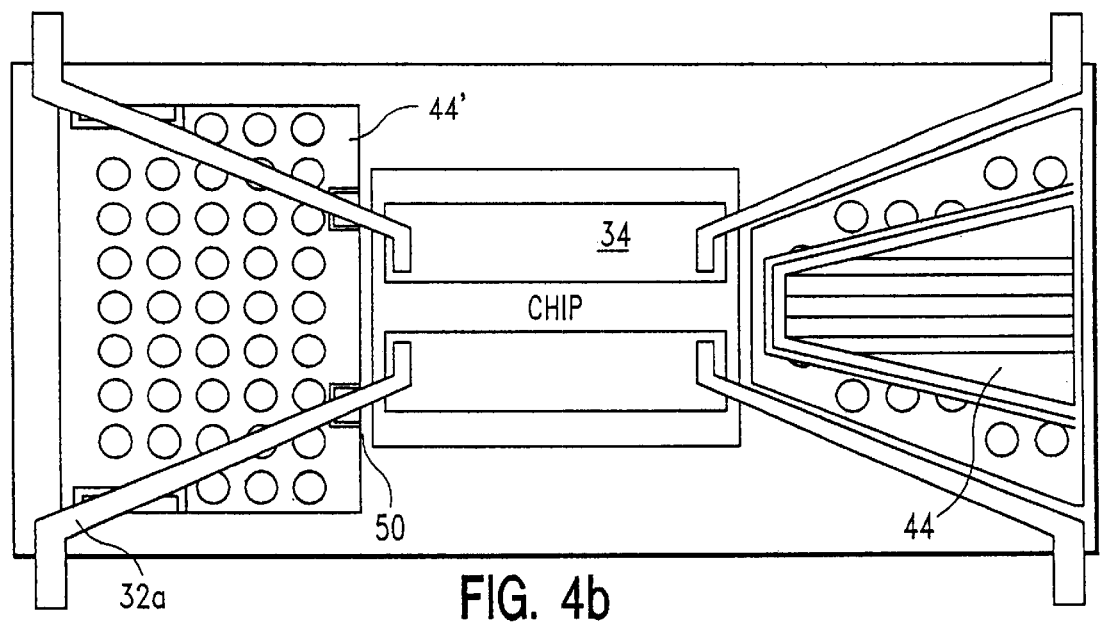
FIG. 4b is a top view of two embodiments, one on the left showing a module comprising a body held at a lower level than the dummy chip of FIG. 4a by standoffs, the one on the right showing a body having a thickness similar to that of the chip and attached to a lead frame tie bar with tape.
Figure 4C:
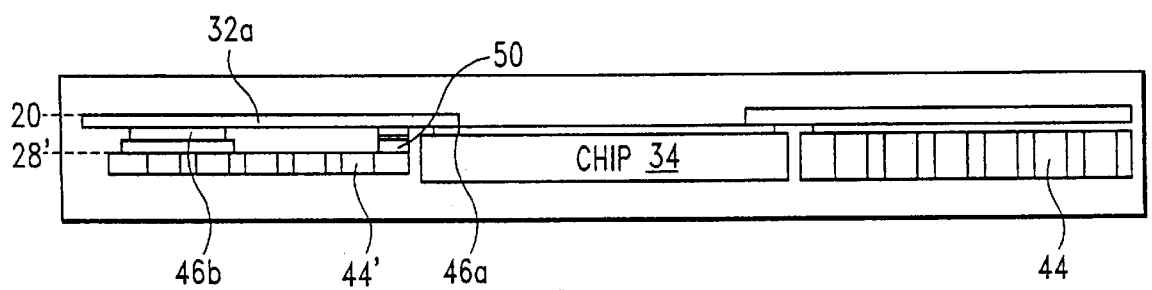
FIG. 4c is a cross sectional view of the embodiments of FIG. 4b.
Figures 4D, 4E, 4F:
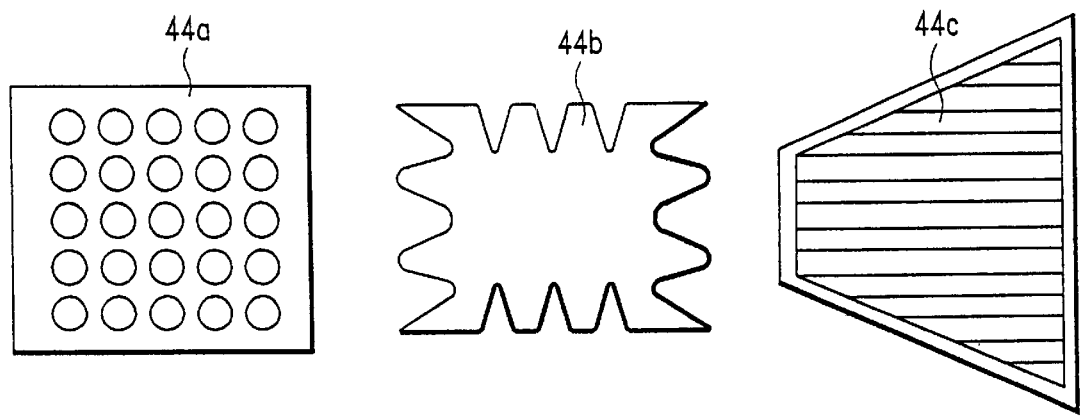
FIGS. 4d–4f are top views of bodies having various shapes.

In another alternate embodiment, body 44, such as a dummy semiconductor chip, is provided at lower level 28 within encapsulant 26 than level 30 of lead fingers 32a, as shown in FIG. 4a. Body 44 provides a force to balance the force provided by lead fingers 32a. Body 44 may be located on about the same level as active integrated circuit chip 34. In this case, body 44 and chip 34 are both mounted on tape 46a, 46b for holding body 44 and chip 34 in position during assembly. Alternatively, body 44' may be located lower than chip 34, as shown in FIG. 4b and FIG. 4c. In this case standoffs 50 connect body 44 to lead fingers 32a with tape 46b. Force may be controlled by the height of the standoffs. Standoffs 50 can be integral with body 44' and can be fabricated in a molding or stamping operation. In addition to semiconductor, body 44, 44' can be made of a metal such as alloy 42, Invar, Kovar, or copper-invar-copper. It can also be made of an insulator, such as ceramic or liquid crystal polymer. Body 44, 44' can have various shapes 44a, 44b, 44c, as illustrated in FIGS. 4d–4f. These shapes may be designed to control the flow of encapsulant during assembly, to break up large flat surfaces, and to lock body 44, 44' in place in encapsulant. Providing holes partially extending through body 44, 44' breaks up the flat surface to enhance contact with encapsulant and avoid moisture caused problems.

While several embodiments of the invention, together with modifications thereof, have been described in detail herein and illustrated in the accompanying drawings, it will be evident that various further modifications in the design of a down set member are possible without departing from the scope of the invention. Nothing in the above specification is intended to limit the invention more narrowly than the appended claims. The examples given are intended only to be illustrative rather than exclusive.

What is claimed is:

1. A chip package, comprising:

a semiconductor chip having contact pads;

a lead frame having lead fingers on a first major plane extending from an edge of said chip package to a first level adjacent said contact pads, said lead fingers spaced at least a first distance from said contact pads;

an encapsulant encapsulating said chip and a portion of said lead frame; and a tie bar within said encapsulant and spaced a second distance away from said chip, said tie bar comprising a bent portion for providing a major surface of said tie bar substantially parallel to said first major plane and in a spaced relation away from said first major plane, said major surface of said tie bar providing a force to prevent warpage of said chip package by balancing thermal stress between said lead fingers and said encapsulant.

2. A chip package as recited in claim 1, wherein said chip has an area substantially smaller than the package.

3. A chip package as recited in claim 1, wherein said chip has a top surface and said lead fingers extend over said top surface, wherein said first level is defined by said top surface.

4. A chip package as recited in claim 1, wherein said tie bar is lead frame material.

5. A chip package as recited in claim 4, wherein said tie bar extends from a position adjacent an edge of said encapsulant to a position adjacent an edge of said chip.

6. A chip package as recited in claim 4, wherein said tie bar has an A shape.

7. A chip package as recited in claim 4, wherein said tie bar comprises support struts oriented parallel to the flow of liquid plastic compound during molding.

8. A chip package as recited in claim 4, wherein said tie bar comprises a portion of said lead frame that is not electrically connected to a lead finger when packaging is complete.

9. A chip package as recited in claim 8, wherein said tie bar is sufficiently separated from said lead finger to avoid shorting to lead fingers.

10. A chip package as recited in claim 1, wherein said encapsulant has a first TCE, said lead frame has a second TCE, said chip has a third TCE, and said tie bar has a fourth TCE, wherein said fourth TCE is substantially less than said first TCE.

11. A chip package as recited in claim 10, wherein said fourth TCE is between said second TCE and said third TCE.

12. A chip package as recited in claim 10, wherein said fourth TCE is substantially similar to said second TCE.

13. A chip package as recited in claim 1, wherein said contact pads are connected to said leads with wires, wherein said tie bar comprises a body that is not electrically connected to said leads with wires.

14. A chip package as recited in claim 13, further comprising a tape, wherein said tape connects said body and said lead fingers for holding said body in position during assembly.

15. A chip package as recited in claim 1, wherein said lead fingers have regions outside said encapsulant for connection to a substrate, said lead fingers extending out of said encapsulant on said first level above said regions for connection to the substrate.

16. A chip package as recited in claim 1, wherein said tie bar is located below said first level.

* * * * *